United States Patent
Shimbori

(10) Patent No.: US 7,422,839 B2
(45) Date of Patent: Sep. 9, 2008

(54) RESIN FOR POSITIVE RESIST COMPOSITION, AND POSITIVE RESIST COMPOSITION USING THE SAME, LAMINATE AND METHOD FOR FORMING RESIST PATTERN

(75) Inventor: Hiroshi Shimbori, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 202 days.

(21) Appl. No.: 10/561,760

(22) PCT Filed: Jul. 5, 2004

(86) PCT No.: PCT/JP2004/009875

§ 371 (c)(1),
(2), (4) Date: Dec. 21, 2005

(87) PCT Pub. No.: WO2005/003196

PCT Pub. Date: Jan. 13, 2005

(65) Prior Publication Data

US 2007/0099107 A1    May 3, 2007

(30) Foreign Application Priority Data

Jul. 8, 2003   (JP) ............................. 2003-193649
Jul. 8, 2003   (JP) ............................. 2003-193650

(51) Int. Cl.
  G03C 1/76    (2006.01)
  G03F 7/09    (2006.01)
  G03F 7/20    (2006.01)
  G03F 7/30    (2006.01)
  G03F 7/039   (2006.01)

(52) U.S. Cl. ............. 430/271.1; 430/275.1; 430/276.1; 430/326; 430/331; 430/330; 430/919; 430/921; 430/925; 430/270.1

(58) Field of Classification Search ............ None
See application file for complete search history.

(56) References Cited

U.S. PATENT DOCUMENTS

| | | |
|---|---|---|
| 5,736,296 A | 4/1998 | Sato et al. |
| 5,955,240 A | 9/1999 | Sato et al. |
| 6,284,430 B1 | 9/2001 | Oomori et al. |
| 6,419,845 B1 | 7/2002 | Sasaki |
| 6,649,322 B2 | 11/2003 | Kumon et al. |
| 2002/0111459 A1 | 8/2002 | Takeda et al. |
| 2003/0016475 A1 | 1/2003 | Hoshiya et al. |

FOREIGN PATENT DOCUMENTS

| | | |
|---|---|---|
| JP | 8-15864 | 1/1996 |
| JP | 11 339223 | 10/1999 |
| JP | 11-305442 | 11/1999 |
| JP | 11 339223 | 12/1999 |
| JP | 2000-310859 | 7/2000 |
| JP | 2001-081137 | 3/2001 |
| JP | 2001-142214 | 5/2001 |
| JP | 2002-100013 | 4/2002 |
| JP | 2002-234910 | 8/2002 |
| JP | 2003-031867 | 1/2003 |
| JP | 2003-110166 | 4/2003 |
| JP | 2003-124539 | 4/2003 |

OTHER PUBLICATIONS

Machine-assisted English translation of JP 2001-142214 (provided by JPO).*
Office Action dated Oct. 10, 2006 for corresponding Japanese Patent Application No. 2003-193650.
International Search Report from PCT priority application serial No. PCT/JP2004/009875.
Written Opinion from PCT priority application serial No. PCT/JP2004/009875.

* cited by examiner

*Primary Examiner*—Sin J. Lee
(74) *Attorney, Agent, or Firm*—Knobbe, Martens, Olson & Bear LLP

(57) ABSTRACT

The use of a positive resist composition that includes a resin with a specific structure improves the resolution and yields a resist pattern with a favorable shape. In addition, when a resist layer is formed on either a magnetic film or a metallic oxidation prevention film formed on the magnetic film, the layer is less prone to tailing and undercutting phenomena.

6 Claims, No Drawings

RESIN FOR POSITIVE RESIST COMPOSITION, AND POSITIVE RESIST COMPOSITION USING THE SAME, LAMINATE AND METHOD FOR FORMING RESIST PATTERN

This application is the U.S. National Phase under 35 U.S.C. §371 of International Application PCT/JP2004/009875, filed Jul. 5, 2004, which claims priority to Japanese Patent Application No. 2003-193649, filed Jul. 8, 2003, and Japanese Patent Application No. 2003-193650. filed Jul. 8, 2003. The International Application was published under PCT Article 21(2) in a language other than English.

TECHNICAL FIELD

The present invention relates to a resin for a positive resist composition, and a positive resist composition, a laminate, and a method for forming a resist pattern using such a resin, and also relates to a positive resist composition for forming a resist layer that is formed either directly or indirectly on top of a magnetic film, as well as a laminate and a method for forming a resist pattern using such a composition.

BACKGROUND ART

Chemically amplified positive resist compositions include a resin component that exhibits increased alkali solubility under the action of acid, and an acid generator that generates acid on exposure, and a variety of these compositions have been proposed (see the patent references 1 and 2, listed below).

Every year the resolution demanded of these chemically amplified positive resist compositions continues to increase. Furthermore, resist patterns of favorable shape, in which, for example, the side walls of the resist pattern exhibit a high degree of verticalness, are also being demanded.

However, as the requirements for improved resolution and resist patterns of better shape become ever more demanding, conventional chemically amplified positive resist compositions become unable to satisfactorily meet those requirements.

Furthermore, conventionally, in the formation of magnetic heads and the like, a magnetic film is laminated on top of a substrate, and a process is then conducted for providing a resist layer on top of the magnetic film and forming a resist pattern.

In some cases, if required, a metallic oxidation prevention film that prevents oxidation of the magnetic film may be first laminated on top of the magnetic film, and the resist layer then formed on top of this oxidation prevention film.

The magnetic film uses a material containing one or more metals selected from iron, cobalt and nickel as its primary component.

Furthermore, the oxidation prevention film uses a material containing at least one of tantalum and aluminum oxide ($Al_2O_3$) as its primary component.

However, when a conventional positive resist composition is used to form a resist layer on top of a magnetic film, or on top of a metallic oxidation prevention film provided on top of a magnetic film, a pattern of favorable shape is not always obtainable, due to problems such as the so-called tailing phenomenon, where the region near the interface between the resist pattern and the magnetic film or the oxidation prevention film becomes tapered, or the so-called undercutting phenomenon, where, in contrast, the region near the interface between the pattern and the magnetic film or the oxidation prevention film narrows, causing undercutting of the inside of the pattern.

(Patent Reference 1)
Japanese Unexamined Patent Application, First Publication No. Hei 11-305442

(Patent Reference 2)
Japanese Unexamined Patent Application, First Publication No. Hei 8-15864

(Patent Reference 3)
Japanese Unexamined Patent Application, First Publication No. Hei 11-339223

DISCLOSURE OF INVENTION

A first object of the present invention is to provide a positive resist composition that is able to provide improved resolution, and enables the formation of a resist pattern of favorable shape.

A second object of the present invention is to provide a positive resist composition for forming a resist layer provided either directly or indirectly on top of a magnetic film, which enables the formation of a pattern of favorable shape.

In order to achieve the first object described above, the present invention proposes the following aspects, namely, a resin for a positive photoresist composition, a first positive photoresist composition, a first laminate, and a first method for forming a resist pattern.

A resin for the first positive resist composition of the present invention includes a structural unit (a1) represented by a general formula (I) shown below:

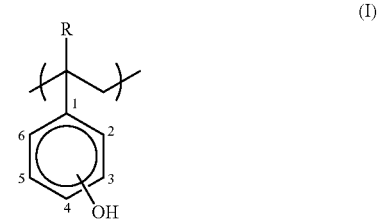

(wherein, R represents —H or —$CH_3$), a structural unit (a2) represented by a general formula (II) shown below:

(wherein, R represents —H or —$CH_3$, and X represents an acid dissociable, dissolution inhibiting group, which is an alkyl group with a tertiary carbon atom in which the tertiary carbon atom is bonded to an ester group (—CO—O—)), a structural unit (a3) represented by a general formula (III) shown below:

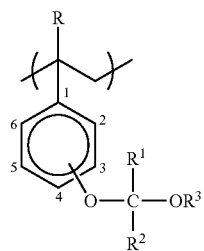

(wherein, R and $R^1$ each represent, independently, —H or —$CH_3$, $R^2$ represents —$CH_3$ or —$C_2H_5$, and $R^3$ represents a lower alkyl group), and a structural unit (a4) represented by a general formula (IV) shown below:

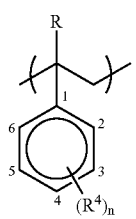

(wherein, R represents —H or —$CH_3$, $R^4$ represents a lower alkyl group, and n represents either 0, or an integer from 1 to 3).

A first positive resist composition of the present invention includes a resin component (A) containing the resin for a positive resist composition according to the present invention, and an acid generator (B) that generates acid on exposure.

A first laminate of the present invention includes a resist layer formed from a positive resist composition of the present invention provided on top of a substrate.

A first method for forming a resist pattern according to the present invention includes the steps of: (1) providing a resist layer formed from a positive resist composition of the present invention on top of a substrate, (2) conducting selective exposure of the resist layer, (3) performing post exposure baking of the selectively exposed resist layer, and (4) conducting alkali developing of the post exposure baked resist layer.

In order to achieve the second object described above, the present invention proposes the following aspects, namely, a second positive photoresist composition, a second laminate, and a second method for forming a resist pattern.

A second positive resist composition of the present invention is a chemically amplified positive resist composition for forming a resist layer, either on top of a substrate and a magnetic film provided on top of the substrate, or on top of a metallic oxidation prevention film provided on top of such a magnetic film, wherein the composition includes:

a resin component (A'), which exhibits increased alkali solubility under the action of acid, and contains a structural unit (a1) represented by the above general formula (I) and a structural unit (a2) represented by the above general formula (II), a diazomethane-based acid generator (B1), and an onium salt-based acid generator (B2).

A second laminate of the present invention includes a substrate, either a magnetic film provided on top of the substrate, or a magnetic film and a metallic oxidation prevention film provided thereon, and a resist layer formed from a second positive resist composition of the present invention provided on top.

A second method for forming a resist pattern according to the present invention includes the steps of: (1) providing a resist layer formed from a positive resist composition of the present invention, either on top of a substrate and a magnetic film provided on top of the substrate, or on top of a metallic oxidation prevention film provided on top of the magnetic film, (2) conducting selective exposure of the resist layer, (3) performing post exposure baking of the selectively exposed resist layer, (4) conducting alkali developing of the post exposure baked resist layer, and (5) conducting a rinse following completion of the alkali developing.

In this description, the term "structural unit" refers to a monomer unit that contributes to the formation of a polymer.

According to the present invention, the resolution of a positive photoresist composition can be improved, and a resist pattern of favorable shape can be obtained.

Furthermore, according to the present invention, a resist pattern with a favorable pattern shape can be formed in a resist layer provided either directly or indirectly on top of a magnetic film.

BEST MODE FOR CARRYING OUT THE INVENTION

[Resin for Positive Resist Composition]

A resin for a positive resist composition of the present invention contains the aforementioned structural units (a1) through (a4).

The resin exhibits increased alkali solubility under the action of acid. In other words, the action of the acid generated from the acid generator on exposure causes bond cleavage within the structural unit (a2) and the structural unit (a3), and this causes the resin, which was initially insoluble in an alkali developing solution, to develop an increased level of alkali solubility.

As a result, by producing a positive resist composition using this resin and an acid generator, a chemically amplified positive resist pattern can be obtained.

Structural Unit (a1)

The structural unit (a1) is represented by the aforementioned general formula (I).

There are no particular restrictions on R, provided R represents either —H or —$CH_3$.

There are no particular restrictions on the bonding position of the —OH group to the benzene ring, although the position labeled 4 in the formula is preferred.

The quantity of the structural unit (a1) within the resin for the positive resist composition is typically within a range from 40 to 80 mol %, and preferably from 50 to 75 mol %.

By ensuring this quantity is at least 40 mol %, the solubility of the resin in the alkali developing solution can be improved, and a favorable improvement in the resist pattern shape can also be obtained, whereas ensuring the quantity is no more than 80 mol % enables a favorable balance to be achieved with the other structural units.

Structural Unit (a2)

The structural unit (a2) is represented by the aforementioned general formula (II).

There are no particular restrictions on R, provided R represents either —H or —CH$_3$.

X represents an acid dissociable, dissolution inhibiting group, which is an alkyl group with a tertiary carbon atom in which the tertiary carbon atom is bonded to an ester group.

When acid is generated from the acid generator on exposure, the acid dissociable, dissolution inhibiting group dissociates from the unit (a2) under the action of the acid, thereby converting the structural unit (a2) to a (meth)acrylic acid unit, and as a result, improving the solubility of the component (A) in an alkali developing solution. In this description, the term "(meth)acrylic acid unit" is a generic term that includes both a methacrylic acid unit and an acrylic acid unit.

This type of acid dissociable, dissolution inhibiting group, namely the group X, can use any of the groups typically used within conventional chemically amplified positive resist compositions.

Examples of the structural unit (a2) include, for example, units represented by a general formula (VII) shown below.

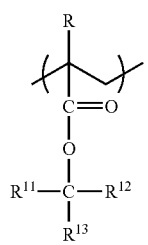

(VII)

In this formula, R is as defined above, R$^{11}$, R$^{12}$ and R$^{13}$ each represent, independently, a straight-chain or branched lower alkyl group, preferably with 1 to 5 carbon atoms. Furthermore, two of these groups may also be bonded together to form a monocyclic or polycyclic alicyclic group (in which the number of carbon atoms within the alicyclic group is preferably from 5 to 12).

In those cases where an alicyclic group is not formed, units in which, R$^{11}$, R$^{12}$ and R$^{13}$ all represent methyl groups are preferred.

In those cases where an alicyclic group is formed, in the case of a monocyclic alicyclic group, units containing a cyclohexyl group or the like are preferred.

Furthermore, in the case of a polycyclic alicyclic group, examples of preferred units include those represented by general formulas (VIII) and (IX) shown below.

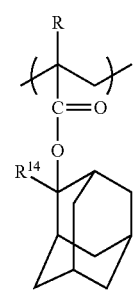

(VIII)

[wherein, R is as defined above, and R$^{14}$ represents a straight-chain or branched lower alkyl group, preferably with 1 to 5 carbon atoms]

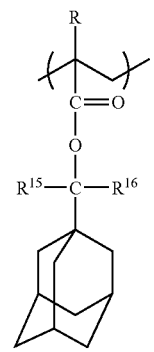

(IX)

[wherein, R is as defined above, and R$^{15}$ and R$^{16}$ each represent, independently, a straight-chain or branched lower alkyl group, preferably with 1 to 5 carbon atoms]

The quantity of the structural unit (a2) within the resin for the positive resist composition is typically within a range from 5 to 30 mol %, and preferably from 10 to 20 mol %.

By ensuring this quantity is at least 5 mol %, an alkali solubility improvement effect can be obtained, and a favorable improvement in the resist pattern shape can also be obtained, whereas ensuring the quantity is no more than 30 mol % enables a favorable balance to be achieved with the other structural units, and also enables easier control of the solubility of the resin in an alkali developing solution.

Structural Unit (a3)

The structural unit (a3) is represented by the aforementioned general formula (III).

The lower alkyl group R$^3$ may be either a straight chain or a branched chain, and preferably contains from 1 to 5 carbon atoms.

There are no particular restrictions on the bonding position of the group bonded to the benzene ring, although the position labeled 4 in the formula is preferred.

Suitable examples of the group bonded to the benzene ring include a 1-methoxyethoxy group, 1-ethoxyethoxy group, 1-n-propoxyethoxy group, 1-isopropoxyethoxy group, 1-n-butoxyethoxy group, 1-isobutoxyethoxy group, 1-(1,1-dimethylethoxy)-1-methylethoxy group, 1-methoxy-1-methylethoxy group, 1-ethoxy-1-methylethoxy group, 1-n-propoxy-1-methylethoxy group, 1-isobutoxy-1-methylethoxy group, 1-methoxy-n-propoxy group, and 1-ethoxy-n-propoxy group.

Of these, a 1-ethoxyethoxy group or a 1-methoxy-n-propoxy group is preferred, and a 1-ethoxyethoxy group is the most desirable.

The quantity of the structural unit (a3) within the component (A) is typically within a range from 10 to 50 mol %, and preferably from 20 to 40 mol %.

By ensuring this quantity is at least 10 mol %, an alkali solubility improvement effect can be obtained, and a favorable resist pattern shape can also be obtained, whereas ensuring the quantity is no more than 50 mol % enables a favorable balance to be achieved with the other structural units.

Structural Unit (a4)

The structural unit (a4) is represented by the aforementioned general formula (IV).

The lower alkyl group R$^4$ may be either a straight chain or a branched chain, and preferably contains from 1 to 5 carbon atoms.

n is either 0 or an integer from 1 to 3, but is preferably 0.

The quantity of the structural unit (a4) within the component (A) is typically within a range from 1 to 35 mol %, and preferably from 5 to 20 mol %.

By ensuring this quantity is at least 1 mol %, the level of improvement in the shape (and particularly the improvement in thickness loss described below) is enhanced, whereas ensuring the quantity is no more than 35 mol % enables a favorable balance to be achieved with the other structural units.

The resin for the positive resist composition may use either a copolymer that contains all of the structural units (a1), (a2), (a3) and (a4), or a mixture of polymers that each contain one or more of these units. A combination of these two options is also possible.

Furthermore, the component (A) within the positive resist composition may also contain other optional units in addition to the above structural units (a1), (a2), (a3) and (a4), although these four structural units preferably account for at least 80 mol %, and even more preferably 90 mol % or more (and most preferably 100 mol %) of the component (A).

Furthermore, a mixture of a copolymer (A1) that contains the aforementioned structural units (a1) and (a3), and a copolymer (A2) that contains the aforementioned structural units (a1), (a2) and (a4) readily produces the desired effects, and is consequently the most preferred configuration for the resin for the positive resist composition. This configuration is also preferred in terms of heat resistance.

The weight ratio between the copolymer (A1) and the copolymer (A2) is typically within a range from 1/9 to 9/1, and is preferably from 3/7 to 7/3.

The polystyrene equivalent weight average molecular weight of the resin for the positive resist composition, determined using GPC (hereafter simply referred to as the weight average molecular weight), is typically within a range from 3,000 to 30,000, and preferably from 5,000 to 20,000.

The resin for the positive resist composition can be obtained by polymerization of the monomers for the aforementioned structural units using known methods.

[First Positive Resist Composition]

A first positive resist composition of the present invention includes the aforementioned resin for a positive resist composition according to the present invention (A), and an acid generator (B) that generates acid on exposure.

The concentration of the component (A) within the first positive resist composition is typically within a range from 5 to 60% by weight.

The component (A) can use either one, or a combination of two or more, of the aforementioned resins for a positive resist composition.

There are no particular restrictions on the component (B), which can use either one, or a combination of two or more, acid generators typically used in chemically amplified positive resist compositions.

There are no particular restrictions on the blend quantity of the component (B), which is typically within a range from 0.2 to 40 parts by weight per 100 parts by weight of the component (A).

Using both a diazomethane-based acid generator (B1) and an onium salt-based acid generator (B2) as the component (B) is preferred in terms of the level of improvement in the resolution, and the ability to obtain a favorable resist pattern shape.

Diazomethane-based Acid Generator (B1)

Specific examples of the diazomethane-based acid generator include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, bis(2,4-dimethylphenylsulfonyl)diazomethane, bis(n-propylsulfonyl)diazomethane, and bis(n-cyclopentylsulfonyl)diazomethane.

Of these, compounds represented by a general formula (V) shown below are preferred,

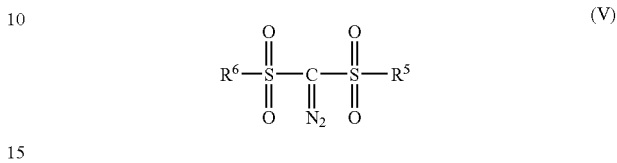

(wherein, $R^5$ and $R^6$ each represent, independently, a straight-chain, branched, or cyclic alkyl group of 3 to 7 carbon atoms), and bis(1,1-dimethylethylsulfonyl)diazomethane is particularly desirable.

Onium Salt-based Acid Generator (B2)

Specific examples of the onium salt include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate.

Of these compounds, onium salts containing a fluorinated alkylsulfonate ion as the anion are preferred.

Of these, salts represented by a general formula (VI) shown below are preferred,

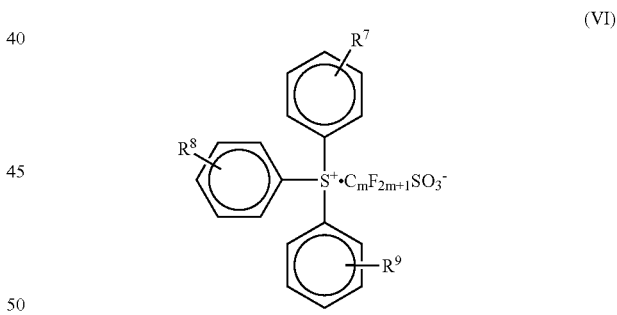

(wherein, $R^7$, $R^8$ and $R^9$ each represent, independently, a hydrogen atom, or an alkyl group or alkoxyl group of 1 to 4 carbon atoms, and m represents an integer from 1 to 10), and triphenylsulfonium trifluoromethanesulfonate is particularly desirable.

The components (B1) and (B2) can each use either a single material, or a combination of two or more materials.

The component (B1) is used in a quantity within a range from 0.1 to 20 parts by weight, and preferably from 1 to 10 parts by weight, per 100 parts by weight of the component (A). Ensuring this quantity is at least 0.1 parts by weight is particularly effective in improving the so-called tailing phenomenon described below, whereas using a quantity of no more than 20 parts by weight ensures a more favorable balance with the component (B2).

The component (B2) is used in a quantity within a range from 0.1 to 20 parts by weight, and preferably from 0.1 to 5 parts by weight, per 100 parts by weight of the component (A). Ensuring this quantity is at least 0.1 parts by weight is particularly effective in improving the so-called undercutting phenomenon described below, whereas using a quantity of no more than 20 parts by weight ensures a more favorable balance with the component (B1). In those cases where a mixture of a component (B1) and a component (B2) is used, the weight ratio (B1):(B2) is typically within a range from 1:1 to 10:1, and preferably from 1.5:1 to 5:1.

Organic Solvent (C)

A first positive resist composition of the present invention can be produced by dissolving the materials in an organic solvent (C).

The component (C) may be any solvent capable of dissolving the various components to generate a uniform solution, and one or more solvents selected from known materials used as the solvents for conventional chemically amplified resists can be used.

The quantity used of the component (C) is selected so that the solid fraction including the component (A) and the component (B) accounts for 3 to 30% by weight, and preferably 5 to 20% by weight, of the resulting solution.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent of two or more different solvents.

Nitrogen-containing Organic Compound (D)

In the positive resist composition, in order to improve the resist pattern shape and the post exposure stability of the latent image formed by the pattern-wise exposure of the resist layer, a nitrogen-containing organic compound can also be added as an optional component (D).

A multitude of these nitrogen-containing organic compounds have already been proposed, and any of these known compounds can be used, although an amine, and particularly a secondary lower aliphatic amine or tertiary lower aliphatic amine, is preferred.

Here, a lower aliphatic amine refers to an alkyl or alkylalcohol amine of no more than 5 carbon atoms, and specific examples of these secondary and tertiary amines include trimethylamine, diethylamine, triethylamine, di-n-propylamine, tri-n-propylamine, tripentylamine, diethanolamine, triethanolamine, and triisopropanolamine, and of these alkanolamines such as triethanolamine are particularly preferred.

These compounds may be used alone, or in combinations of two or more different compounds.

These compounds are typically used in a quantity within a range from 0.01 to 5.0% weight, relative to the weight of the component (A).

Furthermore, in order to prevent any deterioration in sensitivity caused by the addition of the aforementioned component (D), and improve the resist pattern shape, the post exposure stability of the latent image formed by the pattern-wise exposure of the resist layer, and the sensitivity adjustment and the like, an organic carboxylic acid, or a phosphorus oxo acid or derivative thereof can also be added as another optional component (E). The component (D) and the component (E) can be used in combination, or either one may also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other Optional Components

Miscible additives can also be added to a first positive resist composition of the present invention according to need, including additive resins for improving the properties of the resist film, surfactants for improving the ease of application, dissolution inhibitors, plasticizers, stabilizers, colorants and halation prevention agents.

[First Laminate]

A first laminate of the present invention includes a resist layer formed from a first positive resist composition of the present invention, provided on top of a substrate.

[First Method for Forming a Resist Pattern]

A first method for forming a resist pattern according to the present invention includes the steps of: (1) providing a resist layer formed from a first positive resist composition of the present invention on top of a substrate, (2) conducting selective exposure of the resist layer, (3) performing post exposure baking of the selectively exposed resist layer, and (4) conducting alkali developing of the post exposure baked resist layer.

[Second Positive Resist Composition]

Component (A')

The component (A') is a resin component (A') that exhibits increased alkali solubility under the action of acid. In other words, the action of the acid generated from the component (B1) and the component (B2) on exposure causes bond cleavage within the structural unit (a2) and the optional structural unit (a3), and this causes the component (A'), which was initially insoluble in an alkali developing solution, to develop an increased level of alkali solubility. As a result, a positive resist pattern can be obtained.

Structural Unit (a1)

Structural Unit (a2)

For the structural units (a1) and (a2), the description provided above in relation to the resin for the positive photoresist composition applies.

The component (A') may use either a copolymer that contains both of the structural units (a1) and (a2), or a mixture of polymers that each contain one of these units. A combination of these two options is also possible.

This also applies to the optional structural units (a3) and (a4) described below.

Structural Unit (a3)

Structural Unit (a4)

For the structural units (a3) and (a4), with the exception that these units are optional components within the component (A'), the description provided above in relation to the resin for the positive photoresist composition applies. The quantity of the structural unit (a4) within the component (A') is typically within a range from 0 to 35 mol %, and preferably from 1 to 35 mol %, and even more preferably from 5 to 20 mol %.

The component (A') may also include optional units in addition to the structural units (a1) and (a2), but these additional structural units other than the structural units (a1) and (a2) are preferably the structural units (a3) and (a4).

In the component (A'), a mixture of a copolymer (A1) that contains the aforementioned structural units (a1) and (a3), and a copolymer (A2) that contains the aforementioned structural units (a1), (a2) and (a4) readily produces the desired effects, and is consequently the most preferred configuration. Furthermore, this configuration is also preferred in terms of heat resistance.

The weight ratio between the copolymer (A1) and the copolymer (A2) is typically within a range from 1/9 to 9/1, and is preferably from 3/7 to 7/3.

The polystyrene equivalent weight average molecular weight of the component (A'), determined using GPC (hereafter simply referred to as the weight average molecular weight), is typically within a range from 3,000 to 30,000, and preferably from 5,000 to 20,000.

The component (A') can be obtained by polymerization of the monomers for the aforementioned structural units using known methods.

The concentration of the component (A') within the positive resist composition is typically within a range from 5 to 60% by weight.

The component (A') can be used alone, or as a combination of two or more different components.

Diazomethane-based Acid Generator (B1)

Onium Salt-based Acid Generator (B2)

For the diazomethane-based acid generator (B1) and the onium salt-based acid generator (B2), the description provided above in relation to the first positive photoresist composition applies. Of course, within that description, the term "first positive photoresist composition" should be replaced with "second positive photoresist composition".

Organic Solvent (C)

Nitrogen-containing Organic Compound (D)

Component (E)

Optional Components

For the organic solvent (C), the nitrogen-containing organic compound (D), the component (E), and any optional components, the description provided above in relation to the first positive photoresist composition applies.

[Second Laminate]

A second laminate of the present invention includes a substrate, either a magnetic film provided on top of the substrate, or a magnetic film and a metallic oxidation prevention film provided thereon, and a resist layer formed from a positive resist composition of the present invention provided on top.

[Second Method for Forming a Resist Pattern]

A second method for forming a resist pattern according to the present invention includes the steps of: (1) providing a resist layer formed from a positive resist composition of the present invention, either on top of a substrate and a magnetic film provided on top of the substrate, or on top of a metallic oxidation prevention film provided on top of the magnetic film, (2) conducting selective exposure of the resist layer, (3) performing post exposure baking (PEB) of the selectively exposed resist layer, and (4) conducting alkali developing of the post exposure baked resist layer.

As follows is a more detailed description of the first and second methods for forming a resist pattern.

The substrate can use a silicon substrate, for example.

Furthermore, although there are no particular restrictions on the thickness of the resist layer, the thickness is typically selected within a range from 0.1 to 10 µm, and preferably from 0.8 to 8 µm, depending on the application.

Furthermore, although there are no particular restrictions on the wavelength of the exposure light, a KrF excimer laser, ArF excimer laser or electron beam or the like is typically used as the light source, and a KrF excimer laser or an electron beam is preferred. In the case of an electron beam, exposure can be conducted either through a mask or using direct patterning.

By using the first and second positive photoresist compositions, favorable resolutions can be achieved.

Furthermore, a favorably shaped resist pattern is also obtained. For example, a resist pattern in which the side walls of the pattern exhibit a high degree of verticalness, providing a favorable rectangular shape, can be obtained. In other words, problems such as the so-called tailing phenomenon, where the lower portions of the resist pattern become tapered, or the so-called undercutting phenomenon, where, in contrast, undercutting of the inside of the pattern occurs, can be suppressed. Furthermore, alkali developing is typically conducted using an aqueous alkali solution, and the positive resist compositions of the present invention can also suppress the so-called thickness loss phenomenon, where the upper portion of the pattern is narrowed or eaten away during the alkali developing step. Furthermore, because this type of favorable resist pattern shape can be obtained, pattern collapse becomes less likely, meaning an even higher level of resolution can be realized.

In the laminate and the method for forming a resist pattern described above, the resist layer can be provided either on top of a substrate and a magnetic film provided on top of the substrate, or on top of a metallic oxidation prevention film provided on top of the magnetic film. This type of method can be used, for example, in the formation of a magnetic head or the like.

The metallic oxidation prevention film prevents oxidation of the magnetic film.

In these types of applications, the resist pattern tends to be prone to the tailing or undercutting phenomena. However, the first and second positive photoresist compositions of the present invention readily reduce the occurrence of tailing and undercutting, meaning even in these types of applications, a favorable resist pattern shape and favorable resolution can still be obtained.

Furthermore, in these types of applications where a resist layer is provided on top of a magnetic film, and particularly in those cases where the resist layer is a thin film (with a thickness of no more than 1,000 nm for example), the occurrence of standing waves, caused by reflection of the light off the substrate during exposure, can cause the formation of irregularities in the side walls of the resist pattern. However, the first and second positive photoresist compositions of the present invention are less likely to be affected by such standing waves, meaning irregularities are less likely to form in the side walls of the resist pattern, thus ensuring a favorably shaped resist pattern with minimal line edge roughness (side wall irregularities). In other words, a resist pattern is obtained that is also favorable in this regard.

For example, favorable effects can be obtained in those cases where the principal component of the magnetic film contains one or more of iron, cobalt, and nickel.

Furthermore, favorable effects can also be achieved in those cases where the principal component of the metallic oxidation prevention film provided on top of the magnetic film contains at least one of tantalum and aluminum oxide ($Al_2O_3$).

A principal component refers to a component that accounts for at least 50% by weight, and preferably 80% by weight or greater of the film.

Components other than the principal component within the magnetic film or the oxidation prevention film can be selected appropriately from conventional materials typically used within magnetic films or metallic oxidation prevention films provided on top of such magnetic films.

When forming a magnetic film on a substrate, the magnetic film is preferably formed as the layer in direct contact with the substrate, and in those cases where a metallic oxidation prevention film is formed, this oxidation prevention film is preferably formed directly on top of the magnetic film.

There are no particular restrictions on the thickness of the magnetic film or the oxidation prevention film, and typical thickness values can be used.

EXAMPLES

As follows is a more detailed description of the present invention using a series of examples.

Example 1

Materials containing the components (A) to (E) described below were mixed together and dissolved to prepare a positive resist composition.

A component (A) of the Composition Described Below:

100 parts by weight of a mixed resin that includes 50 parts by weight of a copolymer (A1) (weight average molecular weight: 8,000) containing the structural units (a1) and (a3) listed below, and 50 parts by weight of a copolymer (A2) (weight average molecular weight: 10,000) containing the structural units (a1), (a2) and (a4) listed below.

Copolymer (A1):
65 mol % of a structural unit (a1) of the general formula (I) above, wherein R represents —H, and the bonding position for the —OH group is position 4, and
35 mol % of a structural unit (a3) of the general formula (III) above, wherein R represents —H, the group bonded to the benzene ring is a 1-ethoxyethoxy group, and the bonding position for that group is position 4.

Copolymer (A2):
65 mol % of a structural unit (a1) of the general formula (I) above, wherein R represents —H, and the bonding position for the —OH group is position 4,
25 mol % of a structural unit (a2) of the general formula (VII) above, wherein R represents —H, and $R^{11}$ to $R^{13}$ each represent a methyl group, and
10 mol % of a structural unit (a4) of the general formula (IV) above, wherein R represents —H, and n=0.

Component (B1): 4.0 parts by weight of bis(tert-butylsulfonyl)diazomethane.
Component (B2): 0.5 parts by weight of triphenylsulfonium trifluoromethanesulfonate.
Component (E): 0.3 parts by weight of salicylic acid.
Component (D): 0.3 parts by weight of triethanolamine.
Component (C): 500 parts by weight of propylene glycol monomethyl ether acetate.

This positive type resist composition was applied to the surface of a silicon substrate and heated at 100° C. for 90 seconds, thereby forming a resist layer with a film thickness of 800 nm.

This layer was then selectively irradiated using an exposure apparatus FPA-3000EX3 (product name, manufactured by Canon Inc., NA=0.55, σ=0.33) (exposure wavelength: 248 nm).

The resist layer was then subjected to heating (PEB) treatment at 100° C. for 90 seconds.

Subsequent developing for 60 seconds in an aqueous solution of tetramethylammonium hydroxide with a concentration of 2.38% by weight yielded an isolated pattern with a width of 120 nm. Inspection of the cross-sectional shape of the pattern using a measuring SEM (S4500, manufactured by Hitachi, Ltd.) revealed a favorable rectangular shape with no side wall irregularities.

Furthermore, when an oxidation prevention film containing tantalum as the principal component was provided on top of the silicon substrate, and then a resist layer was formed in the same manner as above, a similar favorable evaluation resulted.

Comparative Example 1

With the exception of replacing the copolymer (A2) from the example 1 with a copolymer containing the structural units listed below, an evaluation was conducted in the same manner as the example 1.
Copolymer (A2):
65 mol % of a structural unit (a1) of the general formula (I) above, wherein R represents —H, and the bonding position for the —OH group is position 4, and
35 mol % of a structural unit (a2) of the general formula (VII) above, wherein R represents —H, and $R^{11}$ to $R^{13}$ each represent a methyl group.

As a result, the upper portion of the pattern narrowed, and a favorably shaped pattern could not be obtained.

Comparative Example 2

With the exception of not using the copolymer (A2) from the example 1, but rather using 100 parts by weight of the copolymer (A1), an evaluation was conducted in the same manner as the example 1.

As a result, undercutting occurred in the resist pattern, pattern collapse was observed, and the resolution was poor.

Comparative Example 3

With the exception of not using the copolymer (A1) from the example 1, but rather using 100 parts by weight of the copolymer (A2), an evaluation was conducted in the same manner as the example 1.

As a result, tailing occurred in the resist pattern, and a favorably shaped pattern could not be obtained.

In this manner, the example of the present invention enabled the formation of a favorable resist pattern shape, and also yielded favorable resolution.

Example 2

Materials containing the components (A') to (E) described below were mixed together and dissolved to prepare a positive resist composition.

Component (A'):
 100 parts by weight of a copolymer (A2) (weight average molecular weight: 10,000) containing the structural units (a1), (a2) and (a4) listed below.
 65 mol % of a structural unit (a1) of the general formula (I) above, wherein R represents —H, and the bonding position for the —OH group is position 4,
 25 mol % of a structural unit (a2) of the general formula (VII) above, wherein R represents —H, and $R^{11}$ to $R^{13}$ each represent a methyl group, and
 10 mol % of a structural unit (a4) of the general formula (IV) above, wherein R represents —H, and n=0.
Component (B1): 10.0 parts by weight of bis(tert-butylsulfonyl)diazomethane.
Component (B2): 0.5 parts by weight of triphenylsulfonium trifluoromethanesulfonate.
Component (E): 0.3 parts by weight of salicylic acid.
Component (D): 0.3 parts by weight of triethanolamine.
Component (C): 500 parts by weight of propylene glycol monomethyl ether acetate.

A sputtered film (a magnetic film) containing iron and nickel was formed on the surface of a silicon substrate, and a sputtered film (an oxidation prevention film) of Ta was then formed on top of the magnetic film.

The aforementioned positive type resist composition was then applied to the surface of the oxidation prevention film, and heated at 100° C. for 90 seconds, thereby forming a resist layer with a film thickness of 800 nm.

This layer was then selectively irradiated using a KrF exposure apparatus FPA-3000EX3 (product name, manufactured by Canon Inc.) (exposure wavelength: 248 nm).

The resist layer was then subjected to heating (PEB) treatment at 100° C. for 90 seconds.

Subsequently, the layer was developed for 60 seconds in an aqueous solution of tetramethylammonium hydroxide with a concentration of 2.38% by weight.

The resulting isolated pattern with a width of 120 nm exhibited neither tailing nor undercutting phenomena. Furthermore, the pattern was a favorable rectangular shape with no side wall irregularities.

Example 3

A positive resist composition was produced by mixing and dissolving the materials listed below, and subsequent evaluation in the same manner as the example 2 yielded a similar result to the example 2.

A Component (A') of the Composition Described Below:
 100 parts by weight of a mixed resin that includes 50 parts by weight of the copolymer (A2) (weight average molecular weight: 10,000) used in the example 2, and 50 parts by weight of a copolymer (A1) (weight average molecular weight: 8,000) containing the structural units (a1) and (a3) listed below.
 65 mol % of a structural unit (a1) of the general formula (I) above, wherein R represents —H, and the bonding position for the —OH group is position 4, and
 35 mol % of a structural unit (a3) of the general formula (III) above, wherein R represents —H, the group bonded to the benzene ring is a 1-ethoxyethoxy group, and the bonding position for that group is position 4.
Component (B1): 4.0 parts by weight of bis(tert-butylsulfonyl)diazomethane.
Component (B2): 0.5 parts by weight of triphenylsulfonium trifluoromethanesulfonate.
Component (E): 0.3 parts by weight of salicylic acid.
Component (D): 0.3 parts by weight of triethanolamine.
Component (C): 500 parts by weight of propylene glycol monomethyl ether acetate.

The resulting isolated pattern with a width of 120 nm exhibited neither tailing nor undercutting phenomena. Furthermore, the pattern was a favorable rectangular shape with no side wall irregularities.

Comparative Example 4

With the exception of not adding the component (B1), a positive resist composition was produced and then evaluated in the same manner as the example 2. The results revealed the occurrence of the tailing phenomenon, and a deterioration in the shape.

Comparative Example 5

With the exception of not adding the components (A2) and (B2), a positive resist composition was produced and then evaluated in the same manner as the example 3. The results revealed the occurrence of undercutting, a deterioration in the shape, and the presence of pattern collapse.

In this manner, it was confirmed that the examples according to the present invention enabled the formation of favorably shaped resist patterns.

The invention claimed is:

1. A laminate, comprising a substrate, either a magnetic film provided on top of said substrate, or said magnetic film and a metallic oxidation prevention film provided thereon, and a resist layer formed from a positive resist composition on top of either said magnetic film or said magnetic film and said metallic oxidation prevention film provided thereon, wherein said positive resist composition comprises:

a resin component (A'), which exhibits increased alkali solubility under action of acid, and comprises a structural unit (a1) represented by a general formula (I) shown below:

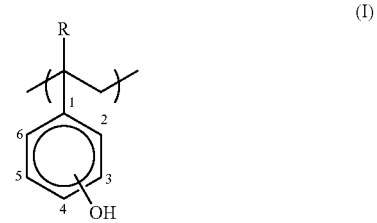

(I)

(wherein, R represents —H or —$CH_3$), and
 a structural unit (a2) represented by a general formula (II) shown below:

a structural unit (a2) represented by a general formula (II) shown below:

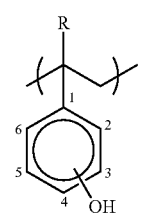

(II)

(II)

(wherein, R represents —H or —CH₃, and X represents an acid dissociable, dissolution inhibiting group, which is an alkyl group with a tertiary carbon atom in which said tertiary carbon atom is bonded to an ester group),
a diazomethane-based acid generator (B1), and
an onium salt-based acid generator (B2).

2. A laminate according to claim 1, wherein a principal component of said magnetic film comprises one or more metals selected from a group consisting of iron, cobalt, and nickel.

3. A laminate according to claim 1, wherein a principal component of said oxidation prevention film comprises one or more materials selected from a group consisting of tantalum and aluminum oxide (Al₂O₃).

4. A method for forming a resist pattern, comprising the steps of: (1) providing a resist layer formed from a positive resist composition, either on top of a substrate and a magnetic film provided on top of said substrate, or on top of a metallic oxidation prevention film provided on top of said magnetic film, (2) conducting selective exposure of said resist layer, (3) performing post exposure baking of said selectively exposed resist layer, and (4) conducting alkali developing of said post exposure baked resist layer, wherein said positive resist composition comprises:

a resin component (A'), which exhibits increased alkali solubility under action of acid, and comprises a structural unit (a1) represented by a general formula (I) shown below:

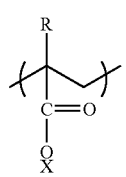

(I)

(wherein, R represents —H or —CH₃), and
a structural unit (a2) represented by a general formula (II) shown below:

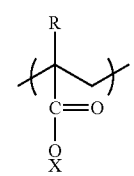

(II)

(wherein, R represents —H or —CH₃, and X represents an acid dissociable, dissolution inhibiting group, which is an alkyl group with a tertiary carbon atom in which said tertiary carbon atom is bonded to an ester group),
a diazomethane-based acid generator (B1), and
an onium salt-based acid generator (B2).

5. A method for forming a resist pattern according to claim 4, wherein a material in which a principal component comprises one or more metals selected from a group consisting of iron, cobalt, and nickel is used as said magnetic film.

6. A positive resist composition according to claim 4, wherein a material in which a principal component comprises one or more materials selected from a group consisting of tantalum and aluminum oxide (Alt3) is used as said oxidation prevention film.

* * * * *

UNITED STATES PATENT AND TRADEMARK OFFICE
CERTIFICATE OF CORRECTION

PATENT NO.           : 7,422,839 B2
APPLICATION NO.  : 10/561760
DATED                    : September 9, 2008
INVENTOR(S)          : Hiroshi Shimbori It is certified that error appears in the above-identified patent and that said Letters Patent is hereby corrected as shown below:

On Page 1, No. (56), under "FOREIGN PATENT DOCUMENTS", second entry, delete "JP 11-339223 corresponding to the date 10/1999".

Column 1, Line 11, change "2003-193650." to --2003-193650,--.

Column 16, Line 51, in Claim 1, change "(al)" to --(a1)--.

Column 18, Line 39, in Claim 6, change "(Alt3)" to --($Al_2O_3$)--.

Signed and Sealed this

Twenty-eighth Day of July, 2009

JOHN DOLL
*Acting Director of the United States Patent and Trademark Office*